United States Patent [19]

Vance et al.

[11] Patent Number: 4,521,892

[45] Date of Patent: Jun. 4, 1985

[54] DIRECT CONVERSION RADIO RECEIVER FOR FM SIGNALS

[75] Inventors: Ian A. W. Vance, Newport; John K. Goatcher, Harlow, both of England

[73] Assignee: International Standard Electric Corporation, New York, N.Y.

[21] Appl. No.: 415,782

[22] Filed: Sep. 8, 1982

[30] Foreign Application Priority Data

Sep. 24, 1981 [GB] United Kingdom ............... 8128956

[51] Int. Cl.³ .............................................. H03D 3/00
[52] U.S. Cl. ....................................... 375/88; 375/45; 375/122; 329/110; 329/124; 370/11
[58] Field of Search ................ 375/80, 82, 88, 89, 375/86, 122; 329/50, 110, 122, 124; 328/133; 307/471, 514, 517; 370/11

[56] References Cited

U.S. PATENT DOCUMENTS

| | | | |
|---|---|---|---|
| 3,729,587 | 4/1973 | McGill, Jr. et al. | 375/88 |
| 3,925,614 | 12/1975 | Bousmar | 375/88 |
| 4,021,743 | 5/1977 | Claxton | 375/86 X |
| 4,193,034 | 3/1980 | Vance | 375/88 |
| 4,254,503 | 3/1981 | Vance | 375/91 |
| 4,291,274 | 9/1981 | Suzuki et al. | 328/133 |
| 4,308,500 | 12/1981 | Avins | 328/133 |
| 4,316,150 | 2/1982 | Crosby | 328/133 X |
| 4,322,851 | 3/1982 | Vance | 375/88 |
| 4,378,509 | 3/1983 | Hatchett et al. | 328/133 X |

OTHER PUBLICATIONS

Mims, Forrest M., III, *Engineer's Notebook II*, Radio Shack, 1982, p. 22.

*Primary Examiner*—Robert L. Griffin
*Assistant Examiner*—Raymond C. Glenny
*Attorney, Agent, or Firm*—John T. O'Halloran; Peter R. Ruzek

[57] ABSTRACT

A radio receiver for FM signals having a demodulation system to produce an approximation to an analog output by either measuring the time intervals between successive zero crossings in the I.F. (FIG. 1, FIG. 2B) or by filtering pulses produced at each zero crossing of the I.F. (FIG. 1, FIG. 2A). The demodulator includes two signal pathways in quadrature phase relation, the second signal either lagging or leading the first signal in dependence on whether the received signal frequency is above or below a local oscillator frequency. The modulation frequency can carry analog information separate and apart from the on-off (digital) information.

16 Claims, 18 Drawing Figures

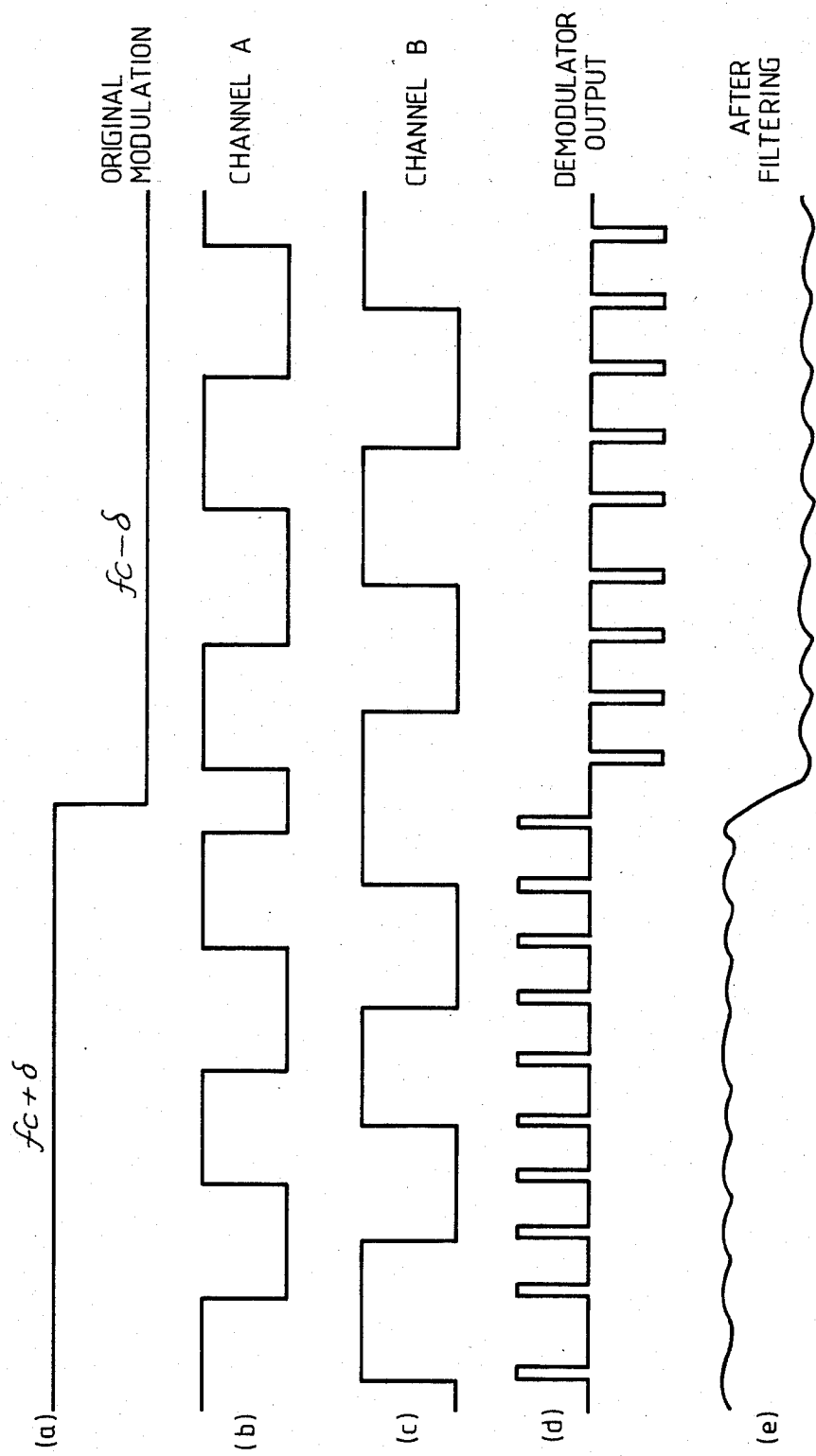

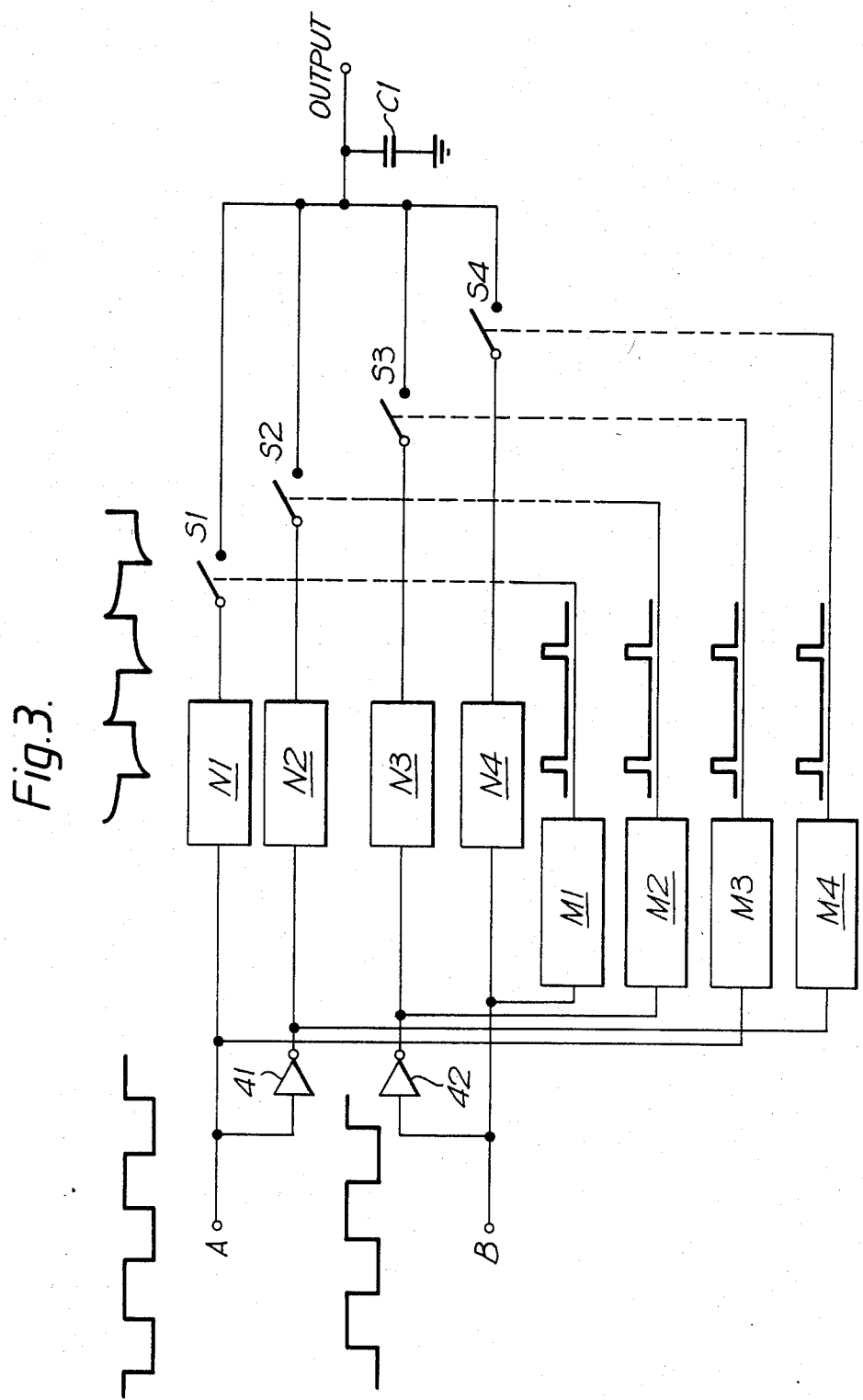

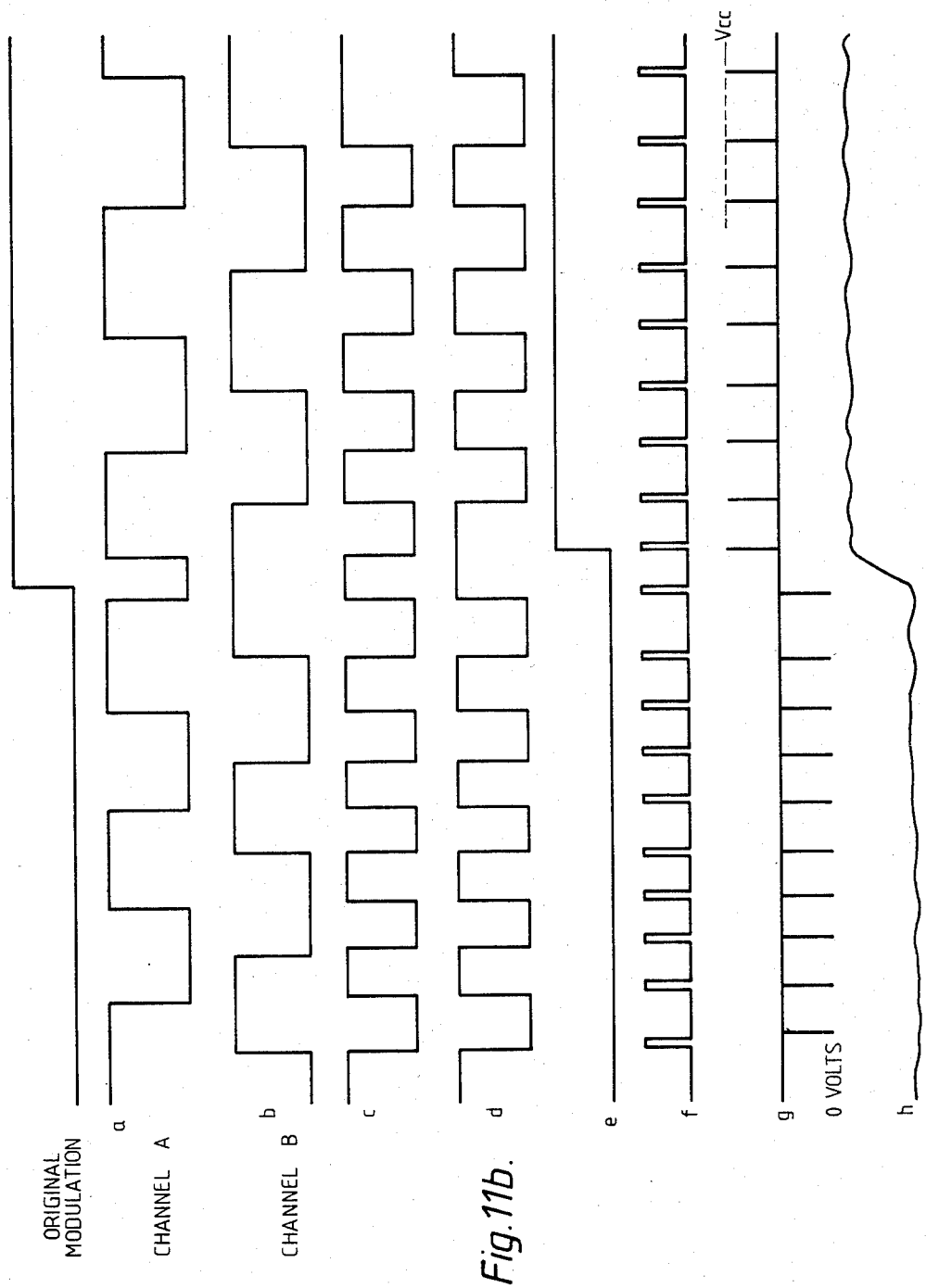

4,521,892

DIRECT CONVERSION RADIO RECEIVER FOR FM SIGNALS

BACKGROUND OF THE INVENTION

This invention relates to a radio receiver for frequency shift keyed signals on an R.F. carrier.

British Patent Specification No. 1517121 describes such a radio receiver, in particular the demodulation circuit, in which the signal processing is performed at a low frequency and therefore instead of adopting a superheterodyne principle, a direct conversion takes place Patent Specification Nos. 41679/78 and 30578/79 (Vance 5 and Vance 8) describe modifications of this arrangement.

In these previous circuits the output of the demodulator is a digital waveform and for some applications an analogue signal is necessary.

SUMMARY OF THE INVENTION

According to the present invention there is provided in or for a radio receiver for receiving frequency modulated signals, and in which mixing with a local oscillator is used to produce quadrature baseband channels, a demodulator circuit comprising a first channel in which the difference frequency will appear, a second channel in which the difference frequency will appear in quadrature with respect to the first channel and lagging or leading in dependence upon the signal frequency being above or below the local oscillator frequency, respectively; and means for measuring the time intervals between each successive zero crossing in the intermediate frequency, and means for generating an output signal representative of the reciprocal of the time interval; or means for filtering pulses produced at each intermediate frequency zero crossing, whereby to simulate an analogue output representative of the information modulated on the r.f. signal.

BRIEF DESCRIPTION OF THE DRAWING

In order that the invention can be clearly understood reference will now be made to the accompanying drawing, in which:

FIG. 2A shows waveforms applicable to the demodulator of FIG. 1 according to our embodiment in which pulses are produced from each I.F. zero crossing and filtered;

FIG. 3 is a block circuit diagram of the demodulator 9 according to the one embodiment;

FIG. 11b shows the waveforms applicable to the circuit of FIG. 11a;

DETAILED DESCRIPTION OF THE PREFERRED EMBODIMENT

The demodulation systems to be described below produce an approximation to an analogue output by either measuring time intervals between successive zero crossings in the I.F. or by filtering pulses produced by each I.F. zero crossing. This produces an output waveform which for many purposes is adequate, and which gives more information than the purely digital circuits.

Figure 1:
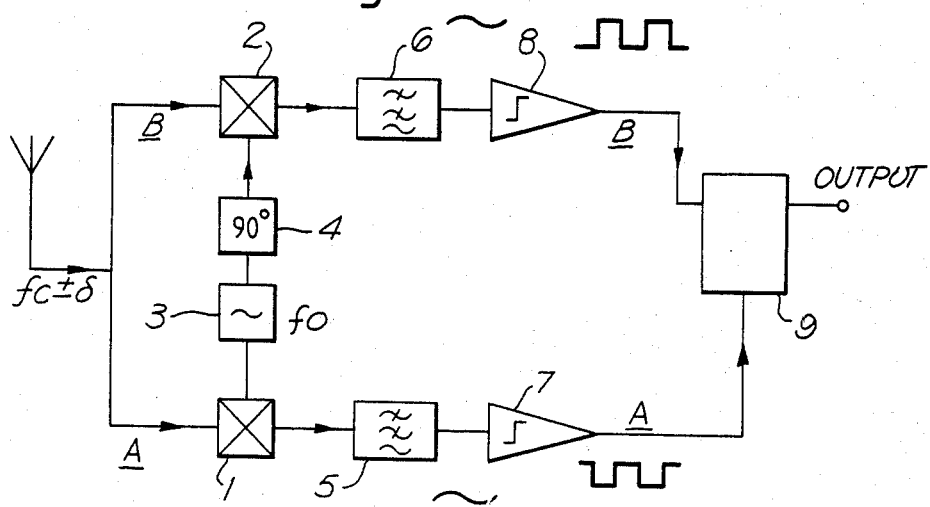
FIG. 1 is a block schematic diagram of an FSK receiver according to a general embodiment of the invention.

In the receiver of FIG. 1 the received radio signals $f_c \pm \delta$, where $f_c$ is a carrier wave frequency and $\delta$ is the FSK modulation deviation, are fed to two high gain mixer circuits 1 and 2. A local oscillator 3 running at the frequency $f_o$ is fed directly to mixer circuit 1 and via a phase shift network 4, which introduces a 90° phase shift, to mixer 2. The outputs of mixer circuits 1 and 2 are fed in respective channels A and B to low pass filters 5 and 6, respectively, which remove unwanted interference e.g. from adjacent channels, and pass the difference frequency between the signal and $f_o$. The outputs of the low-pass filters are amplified in high gain limiting amplifiers 7 and 8 so as to give two fully limited waveforms, which are in quadrature. The quadrature phase shift (4) may also be placed in the incoming signal path rather than in the local oscillator resulting in the same outputs from 7 and 8.

The frequency of the square waves is equal to the difference in frequency between the incoming r.f. signal and the local oscillator.

The difference outputs of the mixer circuits are respectively $+\delta$ and $+\delta - \pi/2$ when the input is $f_c + \delta$, and $-\delta$ and $-\delta - \pi/2$ when the input is $f_c - \delta$. The effect of the low pass filters is to extract the difference frequency $\delta$. The low-pass filter bandwidth is equal to the sideband width of the r.f. signal. The difference or baseband signals which are then amplified in stages 7 and 8 provide fully symmetrically limited outputs at logic level. So, if the deviation is 5 kHz then the baseband signal will be 5 kHz.

Thus when the input signal is offset from its nominal frequency by $+\delta$ kHz there will be delivered from the limiters two square waves in quadrature, as shown in the waveform diagram, FIG. 2A. When the frequency shifts to the other side of the local oscillator ($-\delta$ kHz) then due to the phase inversion this implies in the mixer, the quadrature phase shift is reversed.

Referring to FIG. 2A, waveform (a) represents the original modulation which is depicted as first $f_c + \delta$ and then changes to $f_c - \delta$. As a result, in channel A the square wave output from the limiter 7, represented by waveform (b) lags the square wave output in channel B from limiter 8, represented by waveform (c), by 90°: when the modulation changes to $f_c - \delta$ then channel A leads channel B by 90°. This phase relationship indicates whether the modulation is above or below the local oscillator frequency.

Referring back to FIG. 1, the function of the demodulation circuit 9 is to measure the frequency of this fully limited signal and to determine the relative lead/lag condition of the quadrature signals in the two channels. As the signal is fully limited an estimate of the instantaneous frequency can be made only on the occurrence of an edge in either channel. The baseband demodulation is made to work in one of two basic methods (1) or (2).

(1) For each edge in both channels A and B the demodulator outputs a pulse of fixed length and amplitude. The polarity of each pulse is determined by whether channel A lags or leads channel B (the polarity of this convention is immaterial); the rate of these pulses being equal to four times the frequency difference between the receiver local oscillator and the received r.f. signal. These pulses are then filtered to produce an output equal to this frequency difference.

(2) The demodulator measures the time, t, between each edge in either channel (n.b. edges occur alternately in either channel) and outputs a voltage V, given by $V = k(1/t)$ where k is a constant. Furthermore, the time t may have a positive or negative significance depending whether channel A lags or leads channel B (again the polarity of this convention is immaterial). Hence the output V may be of either polarity.

Figure 2B:
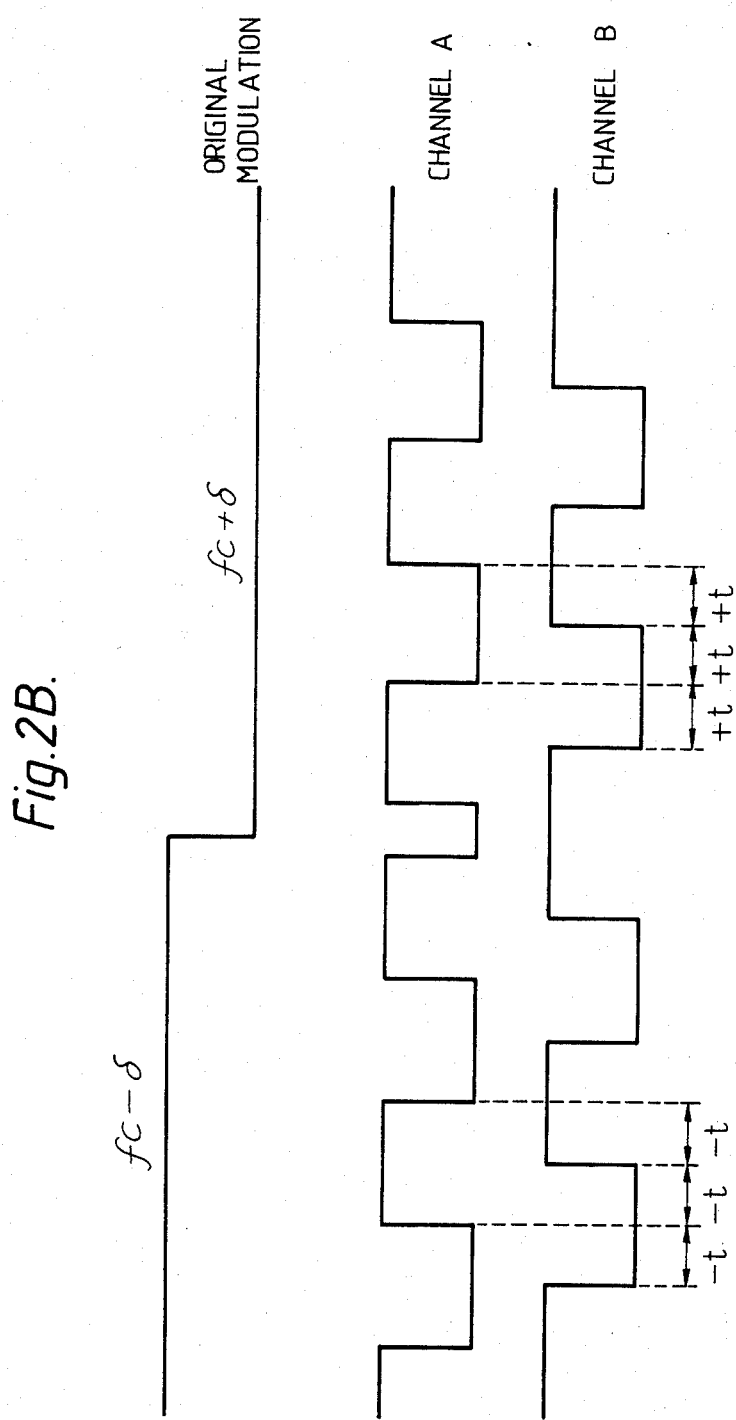
FIG. 2B shows waveforms applicable to an alternative embodiment for the demodulator of FIG. 1 in which the time intervals between successive zero crossings are measured.

FIG. 2B shows where the time t is derived from for the same condition as shown in FIG. 2A.

The actual measurement of time $\pm t$ and the generation of the output $\pm V$ (or an adequate approximation of this) can take many forms. These are described later.

Referring now to FIG. 3 there is shown one embodiment of a demodulator suitable for use as the demodulator 9 shown in FIG. 1.

In FIG. 3 the outputs of channels A and B are fed to inverters 41 and 42 used to give four phases of the input signal. Each of these is applied to a monostable M1 to M4 which is edge triggered, for example on positive going edges. The monostables M1 to M4 produce a short output pulse following the appropriate trigger edge which is used to momentarily close switches $S_1$ to $S_4$. Each input signal and its inverse is also passed through a network $N_1$ to $N_4$ which generates a voltage proportional to $t^{-1}$. The switches $S_1$ to $S_4$ then sample this voltage after the time t and the sample appears at the output. A capacitor $C_1$ is connected to the output so as to hold the analogue value between samples.

Figure 4:
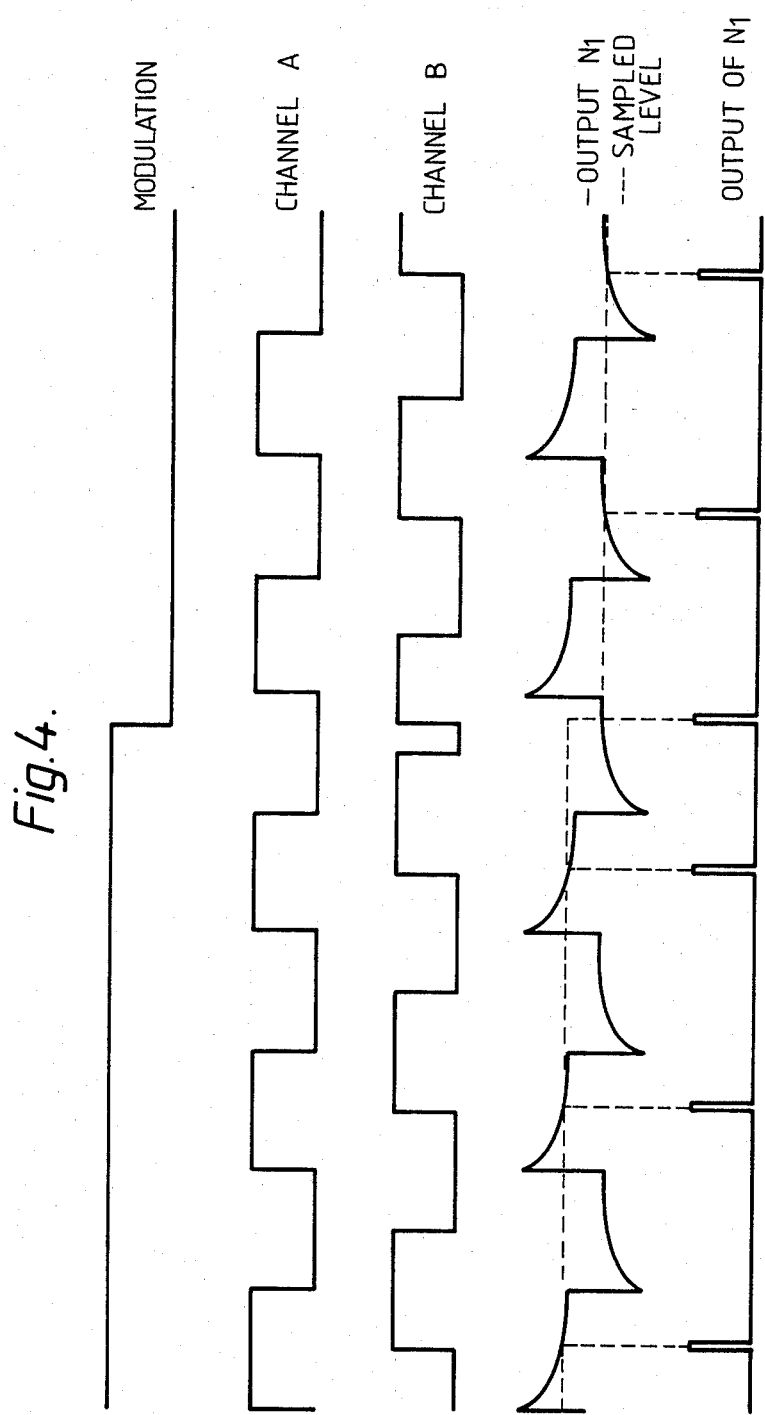
FIG. 4 shows waveforms relating to FIG. 3.

FIG. 4 shows the waveforms occurring in the circuit of FIG. 3 for the case of a fixed deviation frequency, and for that same deviation frequency occurring on the other side of the local oscillator. It is clearly not physically possible to make the networks $N_1$ to $N_2$ exactly produce a voltage proportional to $t^{-1}$ since this implies infinite output as t tends to zero. However, fixing an upper limit of V for some minimum value of t only implies that the demodulator output will limit at a particular peak deviation. This characteristic i.e.

$$v = v_{max} \quad t < t_{min}$$

$$v = kt^{-1} \quad t > t_{min} \quad k = \text{constant}$$

is an adequate approximation and may indeed be desirable to limit the operational noise bandwidth of the demodulator.

FIG. 5 shows some networks N for $N_1$ to $N_4$ of FIG. 3.

Figure 5A:
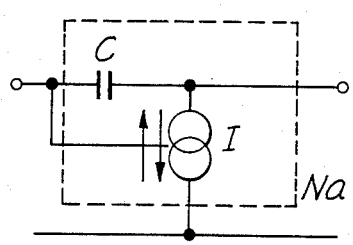
FIGS. 5a, 5b, 5c are simple circuits for the network $N_1$ to $N_4$ in FIG. 3.
Figure 5B:
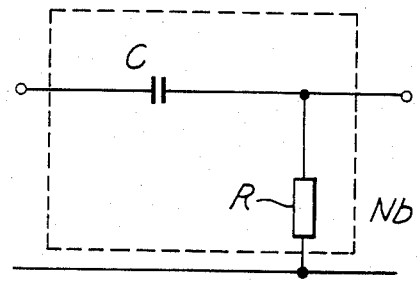
Figure 5C:
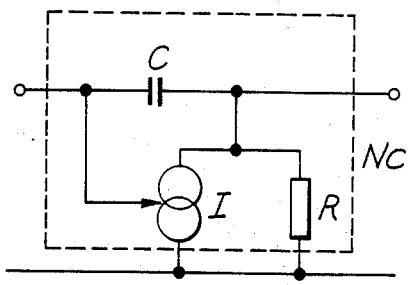

FIG. 5(a) shows a network Na which gives a linear decay of V,

FIG. 5(b) shows a simple approximation network Nb using a CR circuit which gives an exponential decay of V, FIG. 5(c) shows another network Nc in which the output is a combination of a linear decay and an exponential decay.

Each of these networks approximates the ideal output to some extent and the choice can be made on grounds of linearity required versus complexity.

In the circuit of FIG. 3 the monostables can be replaced by any other circuit causing a short output pulse for an appropriate input edge, e.g. a differentiator or a clocked digital network.

Networks $N_1$ to $N_4$ may also be omitted in which case the system of FIG. 3 delivers a digital output with voltage of either $+1$ or $-1$ depending on the position of the incoming signal above or below the local oscillator frequency.

Another form (not shown) of the networks $N_1$ to $N_4$ is possible where a non-linear transfer characteristic is obtained as a piece-wise linear approximation to the reciprocal law. A voltage dependent element such as a diode is used in conjunction with a resistive network to define changes in slope of an output voltage. The digital equivalent of this is also possible.

It is possible to devise more complex circuits for networks N which give more exactly an output voltage proportional to $t^{-1}$.

Figure 6A:
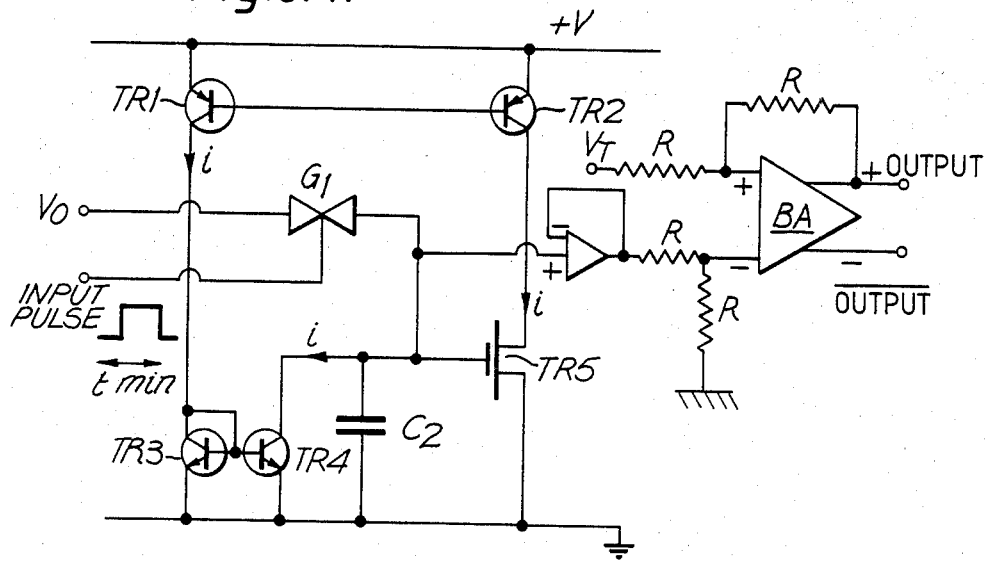
FIG. 6A is a circuit diagram of a more complex embodiment of the network $N_1$ to $N_4$ for FIG. 3.

FIG. 6A shows a possible circuit. As noted above the approximation of holding the output voltage constant for some time $t_{min}$ such that a starting point of the true reciprocal curve is reached, is used. The input pulse from channel A or B to an analogue switch $G_1$ places a voltage $V_o$ on capacitor $C_2$. This voltage on the gate of a field-effect transistor TR5 causes a current i to flow between source and drain. The gate voltage and drain current are then related:

$$i \, \alpha (V_G - V_{TH})^2$$

where:

$V_G$ = Gate voltage $V_{TH}$ = Threshold voltage of the FET.

The voltage on the capacitor $C_2$ is held constant until the end of the input pulse. Thereafter current mirrors TR1, TR2 and TR3, TR4 allow a current i to be drawn from the capacitor $C_2$.

The voltage on the capacitor $C_2$ is then $$V_{TH} + \frac{K}{t + T - t_{min}}$$

where:

k = constant

T = a constant set by the gain of TR5, C, and $V_o$.

If T is arranged to be $= t_{min}$, then an output voltage is obtained that is proportional to $t^{-1}$ for $t > t_{min}$. As the circuit in operation but a bipolar output is required, means are included to give an inverted output. This comprises the form of a balanced amplifier, BA, as shown in FIG. 6A, making both polarities of output available.

Figure 6B:
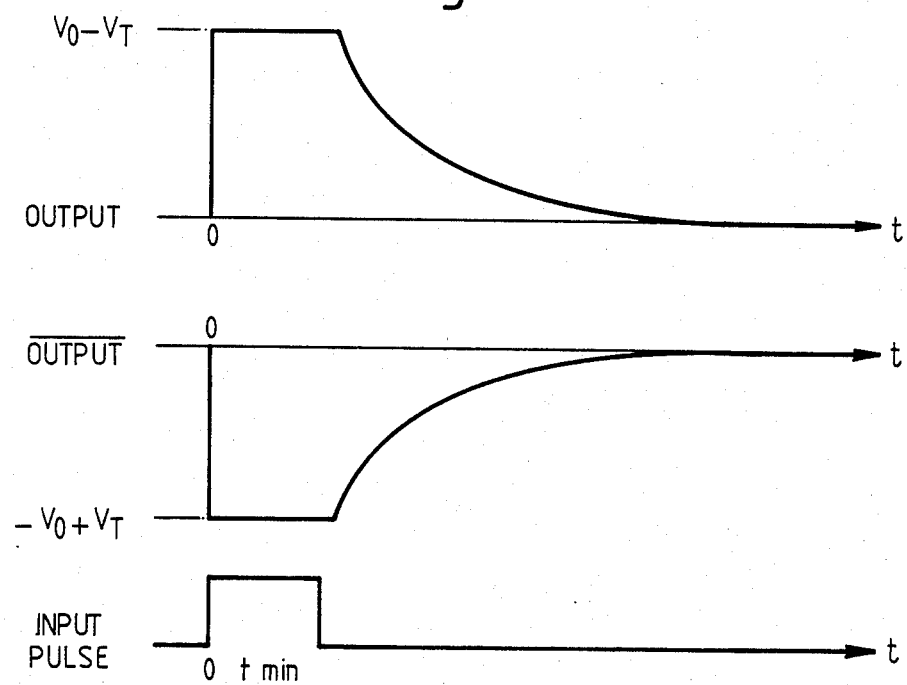
FIG. 6B shows waveforms relevant to the circuit of FIG. 6A.
Figure 7:
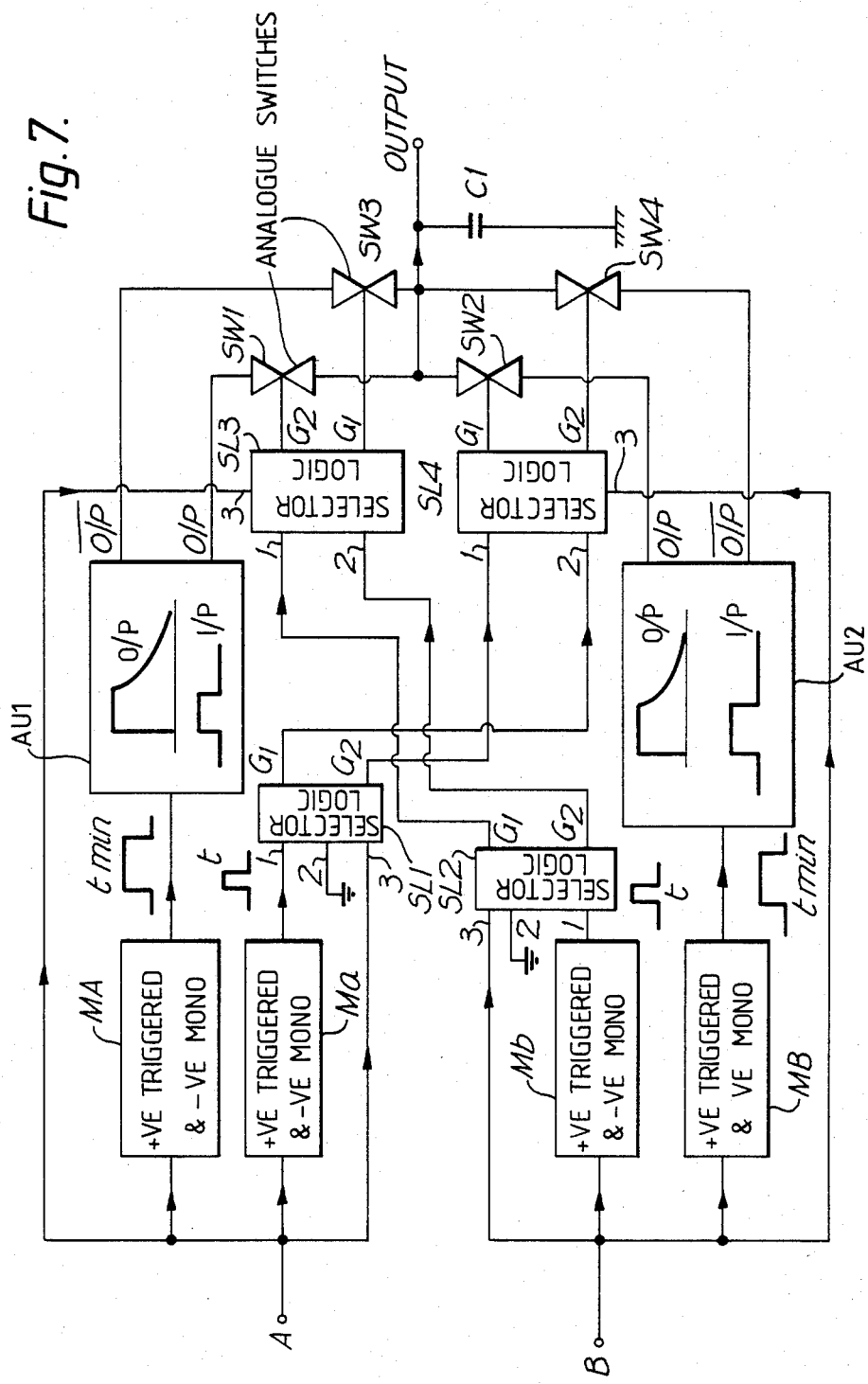
FIG. 7 is a block diagram of another demodulator 9 incorporating the network N of FIG. 6A.
Figure 8:
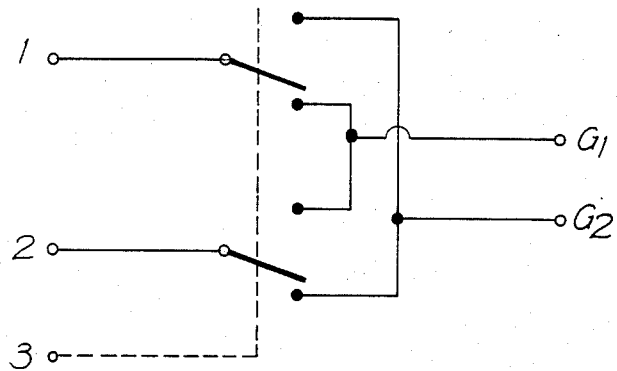
FIG. 8 shows the selector logic function of FIG. 7.

FIG. 7 shows a complete demodulator using the analogue circuit of FIG. 6. From each channel A and B the pulse $t_{min}$ is derived as defined in relation to FIG. 3 and also a short pulse, by use of positive-and-negative-edge triggered monostables $M_A$, $M_B$ and $M_a$, $M_b$, respectively. The analogue unit is as described in FIG. 6 and the correct polarity of the output waveform is selected by the logic selectors (as defined in FIG. 8) and the analogue switches. In more detail the selectors $SL_1$ and $SL_2$ use the changes of polarity of the inputs A and B respectively to invert the polarity of the pulse produced by $M_a$ and $M_b$. This pulse is then applied to $SL_3$ and $SL_4$ which invert the pulse again according to the polarity of the original inputs A and B. These means result in one of switches $SW_1$, $SW_2$, $SW_3$ or $SW_4$ being enabled for each edge occuring in either channel, at the correct time to sample the voltage from the blocks AU1 or AU2 as appropriate.

Figure 9:
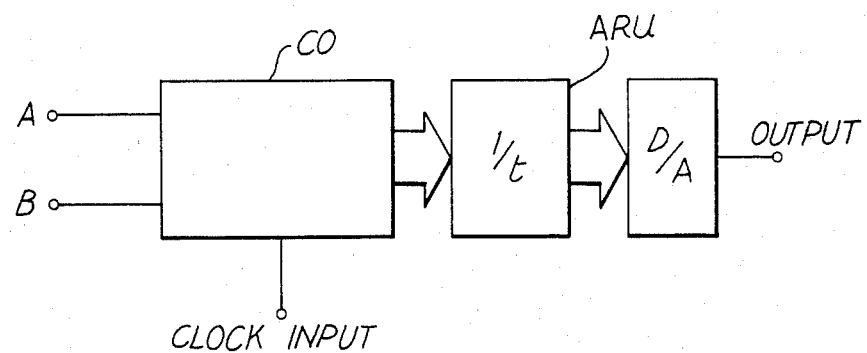
FIG. 9 shows a block diagram of an all digital embodiment for the demodulator 9 of FIG. 1 with reference to FIG. 2B.

FIG. 9 shows an alternative demodulator using an all-digital configuration. A counter CO is arranged to be edge triggered on alternate edges of channels A and B and to count periods of a fast clock from a clock input C1 during each interval thus providing a digital output signal as a measure of t. This digital signal is inverted in an arithmetic unit ARU and converted to an analogue output with a digital to analogue converter D/A.

Figure 10:
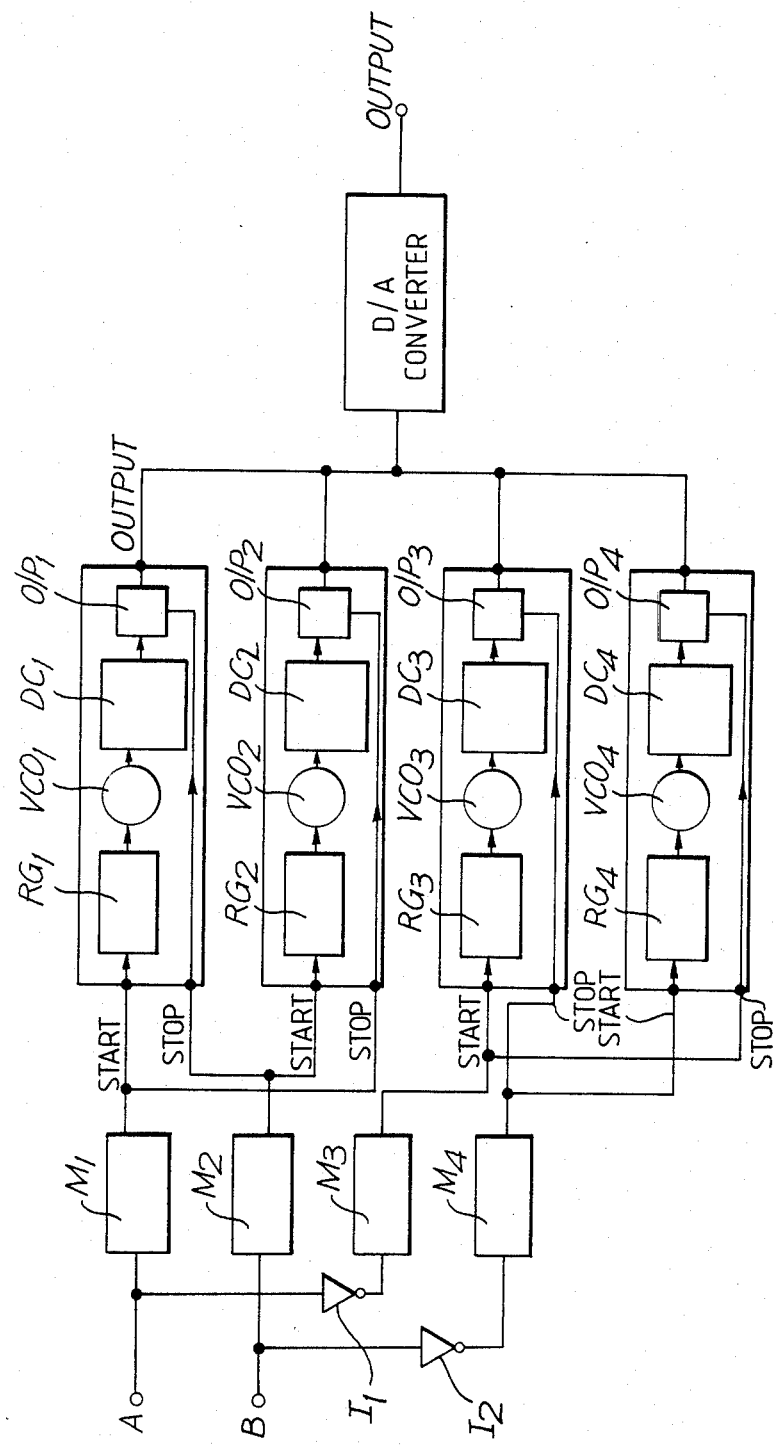
FIG. 10 shows a block diagram of an alternative digital embodiment for the demodulator 9 of FIG. 1 with reference to FIG. 2B.

FIG. 10 shows another embodiment of the demodulator 9 of FIG. 1, with reference to FIG. 2B. Trigger pulses are generated from each channel A and B by edge triggered monostable circuits $M_1$, $M_2$, and for each opposite phase of channels A and B by edge triggered monostables $M_3$ and $M_4$ via inverters $I_1$ and $I_2$. The trigger pulses each initiate a linear ramp function in respective ramp generators such as $RG_1$. This ramp is used to sweep a voltage controlled oscillator $VCO_1$ each cycle of which is counted on a digital counter DC1. The count is stopped and latched to the output gate $O/P_1$ by the trigger pulse from the opposite channel. This is done for each phase of the inputs resulting in four samples per cycle of the input frequency, as in the previous embodiments described.

Figure 11A:
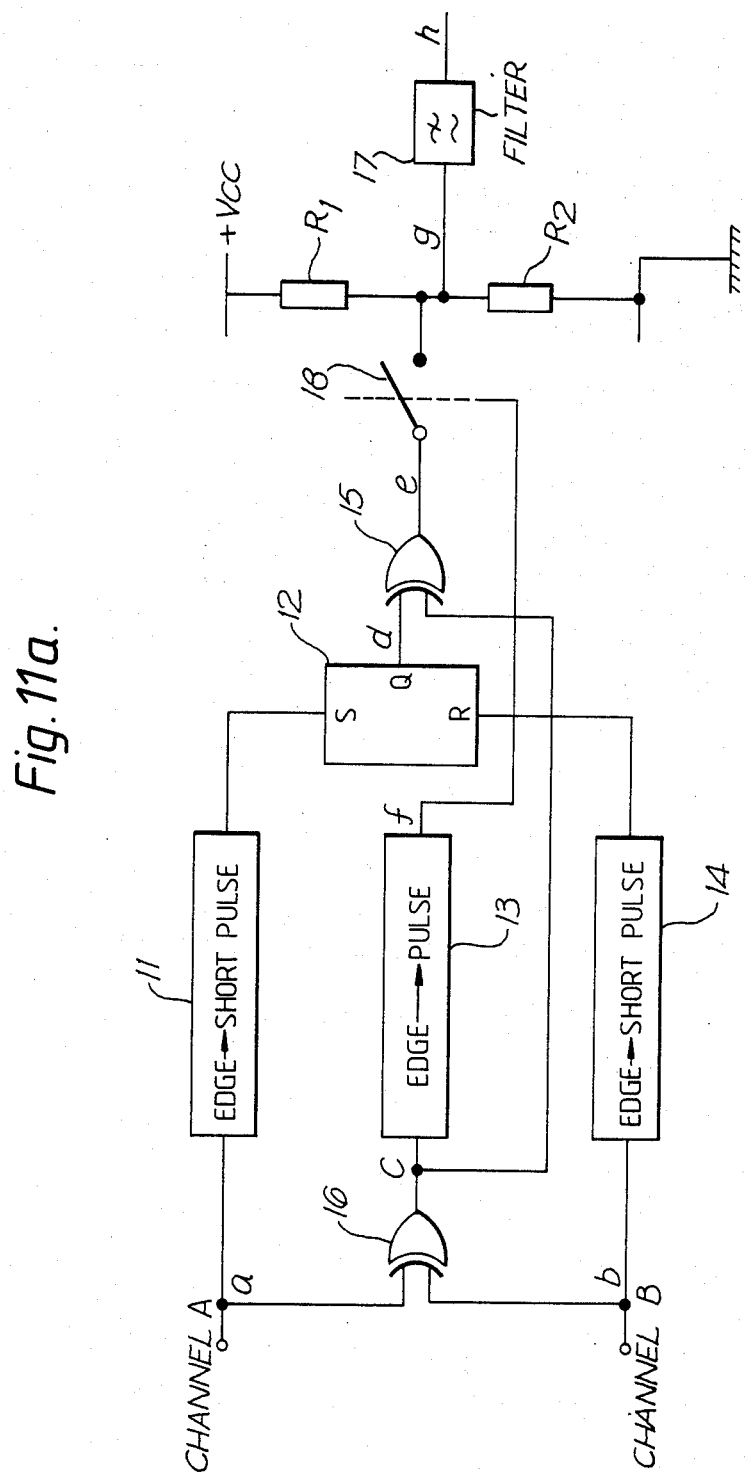
FIG. 11a shows an alternative form of demodulator 9.

FIG. 11a shows a further alternative embodiment of the demodulator 9 of FIG. 1.

Referring now to FIGS. 11a and 11b the outputs of channels A and B, as depicted by waveforms (a) and (b) respectively of FIG. 11b, are applied to points a and b. An exclusive OR gate 16 receives the channel waveforms and provides a square wave output at twice the deviation frequency (waveform (c) in FIG. 11b at point c in FIG. 11a). Blocks 11 and 14 will, in response to every edge in channel A or B respectively, produce a short pulse which sets or resets a flip-flop 12. A longer pulse (of the length required for output) is produced by block 13 which closes an analogue switch 18 for the duration of the pulse. Blocks 11, 13, 14 could be realised by an exclusive OR and a resistor and a capacitor, for example, but the man skilled in the art will realise alternative arrangements depending on the application. In general terms blocks 11, 13, 14 can be described as monostables triggerable by either positive or negative-going pulses. The output of block 13 at f is represented by waveform f in FIG. 11b. The polarity of the pulse is determined by the exclusive OR 16 and exclusive OR 15 through flip-flop 12. This output pulse is applied to junction g between two resistors of equal value $R_1$ and $R_2$ so that the polarity of the pulse at g (g in FIG. 11a) is either 0 Volts when signal e is zero and the switch 18 is closed or $V_{cc}$ when signal e is a "1" and the switch 18 is closed (waveforms c and d in antiphase). Thus waveform e shows whether the incoming r.f. signal is above or below the local oscillator frequency, and this is multiplied by the series of pulses of waveform c since waveform c it will be noted changes its polarity at each edge (both positive and negative) of the deviation frequency. When the analogue gate 18 is open, point g is at $\frac{1}{2}V_{cc}$.

Low-pass or band-pass filter 17 produces an approximation of an analogue output (h).

The previous embodiments described have a limit on the speed with which data or analogue signals can be demodulated, that is to say the number of pulses obtainable at the output per bit of input information, is limited. As the bit becomes smaller and smaller, or the analogue frequency higher, eventually one will achieve one or less than one pulse per bit, or per half cycle.

Figure 12:
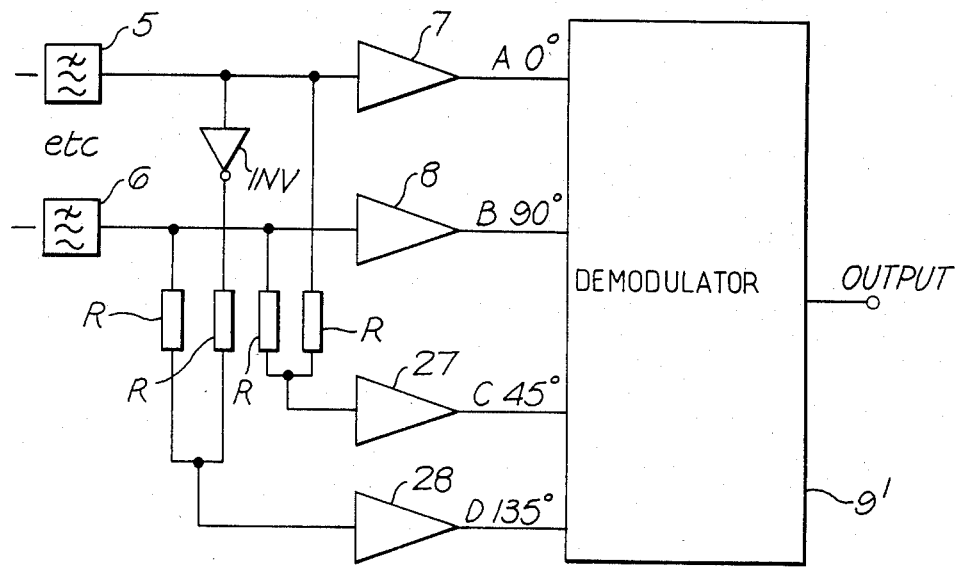
FIG. 12 is a block circuit diagram of a modification to the embodiment of FIG. 1 in which two further channels are synthesised.
Figure 13:
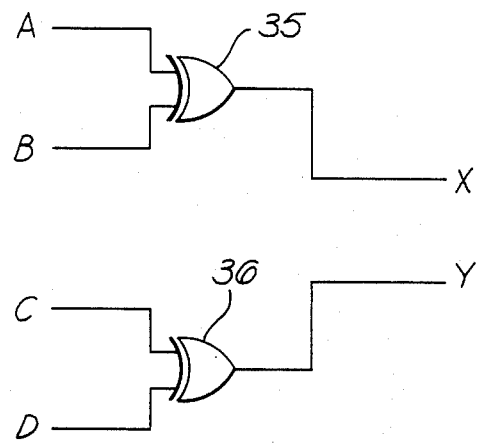
FIG. 13 shows an input channel combining network combining the channel input to the demodulator of FIG. 1.

In terms of a modulation index for a two channel system this limit would be about unity, i.e. the deviation would need to be at least 0.5 times the bit rate. A typical modulation index for data is 0.707 which has special spectral properties and an embodiment for handling this is described with reference to FIG. 12. In FIG. 12 the band-pass filters of FIG. 1 are indicated by the reference number 5 and 6. In FIG. 12 two further channels C and D are created, in addition to channels A and B, at 45° and 135° respectively, by adding channels A and B to obtain channel C and substracting channels A and B to obtain channel D. The subtraction is achieved with an inverter INV. The resistive adder networks, represented by pairs of resistors R output to limiter amplifiers 27 and 28 (similar to 7 and 8) and the four channels are applied to demodulator 9'. Demodulator 9' is the same as demodulator 9 depicted in FIG. 1 except that it comprises also an input channel combining network as shown in FIG. 13, in which channels A and B are fed to an exclusive OR gate 35 and channels C and D are fed to an exclusive OR gate 36. Outputs X and Y provide waveforms to demodulator 9 in the same way as previously described except that there are twice as many pulses as previously, representing the deviation frequency.

FIG. 13 shows how the four channel system of FIG. 12 is reduced to an equivalent 2 channel system for input to the demodulator 9 of FIG. 1. The signals at X and Y are in quadrature but at twice the frequency of those at A and B, thus the outputs X and Y can be used directly in the previously described demodulator circuits in place of A and B.

In a similar fashion further interleaved phases can be created, and more resolution obtained as required.

We claim:

1. In or for a radio receiver for receiving frequency modulated signals with a varying frequency difference from a carrier frequency, and in which mixing with a local oscillator is used to produce quadrature baseband channels, a demodulator circuit comprising a first channel in which a first baseband signal at the difference frequency will appear, a second channel in which a second baseband signal at the difference frequency will appear in quadrature with respect to the first channel and lagging or leading the first baseband signal in dependence upon the received signal frequency being above or below the local oscillator frequency, respectively; and means for converting the outputs of said channels into an analog signal having an amplitude representative of the difference frequency.

2. The demodulator circuit according to claim 1, wherein said converting means includes for each channel a first monostable pulsing circuit which is edge-triggered and produces in response thereto a short output pulse, a time-reciprocal network for producing in response to each zero crossing by the respective baseband signal a signal whose magnitude is representative of the reciprocal of the time interval between successive zero crossings and a switch, wherein the switches are controlled by the output from the monostable circuits such as to periodically sample the outputs of the time-reciprocal networks for filtering.

3. The demodulator according to claim 2 wherein the time-reciprocal network is arranged to provide a signal whose magnitude varies to represent the reciprocal of time for time intervals in excess of a predetermined time interval $t_{min}$, the magnitude of said signal being held constant until the interval $t_{min}$ has elapsed, whereby a starting point on the time reciprocal curve $t^{-1}$ is reached before sampling of the network output commences.

4. The demodulator according to claim 3 comprising for each channel a second pulsing circuit providing a pulse of length $t_{min}$ in respect to each zero crossing by the respective baseband signal to initiate the time reciprocal network.

5. The demodulator according to claim 4 comprising selector logic for controlling the switches, which are analogue switches, periodically in response to output from the first pulsing circuit and from each zero crossing direct from one of the first and second channels.

6. The demodulator according to claim 2, wherein said signal from the time reciprocal circuit has a linear decay.

7. The demodulator according to claim 2, wherein said time reciprocal circuit signal has an exponential decay.

8. The demodulator according to claim 2, wherein said time-reciprocal circuit signal has the combination of a linear and an exponential decay.

9. The demodulator according to claim 2, wherein said time reciprocal circuit provides a non-linear transfer characteristic as a piece-wise linear approximation of exact inversion.

10. The demodulator according to claim 1, wherein said converting means includes a fast clock, means to provide a digital signal representing the count of the clock periods occurring during the interval between each successive zero crossing, means to invert the digital signal and means to convert the digital signal to an analogue output.

11. The demodulator according to claim 1, wherein said converting means includes, for each channel, means for generating a trigger pulse in response to the occurrence of a zero crossing by the respective baseband signal, a ramp generator which is initiated by the trigger pulse, an oscillator variable in dependence of the output of the ramp generator, and means for counting the cycles of the varied oscillator between initiation by one pulse and cessation by a subsequent pulse from the opposite channel.

12. The demodulator according to claim 1 further comprising for each channel a further channel carrying the inverse of the signals in said each channel.

13. The demodulator according to claim 1, said converting means including a pulse producing circuit for producing a pulse of the correct polarity for each edge of the respective baseband signal in the first or second channel, the circuit comprising a first exclusive OR gate for receiving the signals of said first and second channels and in each channel and in the output path of said first exclusive OR gate, respective first, second and third monostable circuits triggerable by positive or negative going pulses, a flip-flop circuit arranged to receive the output of the first and second monostable circuits, a second exclusive-OR gate arranged to receive the output of the flip-flop and the output of the first exclusive OR gate, an analog switch controlled by the third monostable for outputting the second exclusive OR gate output, and a bias network connected to the output of said analog switch in such a manner as to produce a 3-state analogue output.

14. The demodulator circuit according to claim 1, wherein said converting means includes means for measuring the time intervals between successive zero crossings by the respective baseband signals, and means for generating said output signal as a function of the reciprocal of the time intervals.

15. The demodulator circuit according to claim 1, wherein said converting means includes means for producing pulses at zero crossings by the respective baseband signals, and means for filtering such pulses.

16. The demodulator circuit according to claim 14 or 15 further comprising means for providing at least two additional phases of the difference frequency in a respective third and fourth channels, and wherein said converting means is additionally operative on the outputs of said third and fourth channels.

* * * * *